(12) United States Patent
Takeyama et al.

(10) Patent No.: US 6,319,373 B2
(45) Date of Patent: Nov. 20, 2001

(54) SUBSTRATE TRANSFER APPARATUS OF SUBSTRATE PROCESSING SYSTEM

(75) Inventors: Terushige Takeyama, Fuchu; Nobuhito Miyauchi, Hachioji; Takashi Shiba, Fuchu, all of (JP)

(73) Assignee: Anelva Corporation, Tokyo (JP)

( * ) Notice: Subject to any disclaimer, the term of this patent is extended or adjusted under 35 U.S.C. 154(b) by 0 days.

(21) Appl. No.: 09/769,256

(22) Filed: Jan. 26, 2001

(30) Foreign Application Priority Data

Jan. 28, 2000 (JP) .................................................. 12-020279

(51) Int. Cl.$^7$ ............................. C23C 14/56; B65H 5/00; B65H 1/30; B65G 49/00
(52) U.S. Cl. ................................ 204/298.25; 204/298.35; 118/719; 118/729; 156/345; 414/217; 414/221; 414/222.01; 414/222.07; 414/222.08; 414/222.09; 414/226.03; 414/222.12; 414/226.05; 414/937; 414/938
(58) Field of Search ......................... 204/298.25, 298.35; 118/719, 729; 156/345; 414/217, 221, 222.01, 222.07, 222.08, 222.09, 222.12, 223.01, 223.02, 226.03, 226.05, 936, 937, 938, 939

(56) References Cited

FOREIGN PATENT DOCUMENTS

A 8-274142   10/1996   (JP) .

*Primary Examiner*—Rodney G. McDonald
(74) *Attorney, Agent, or Firm*—Oliff & Berridge, PLC

(57) ABSTRACT

A substrate transfer system is used in an in-line film deposition system. The substrate transfer system is provided with an auxiliary vacuum chamber and a main vacuum chamber. The auxiliary vacuum chamber has a plurality of first substrate cassettes. The main vacuum chamber is communicated with another vacuum chamber through which carriers are transferred along a transport path. The main vacuum chamber has two robots and a plurality of second substrate cassettes arranged in parallel on which the substrates is placed. The second substrate cassettes are arranged between the two robots. The substrates are disk-shaped substrates having center holes. The center holes are utilized as hook parts during a pickup operation. Thereby the method of mounting substrates in the holders of carriers etc. is improved without changing the operating speed of the robots. Therefore the amount of substrates transported per unit time is increased and the processing capacity of the substrate processing system is enhanced.

5 Claims, 8 Drawing Sheets

SUBSTRATE TRANSFER APPARATUS OF SUBSTRATE PROCESSING SYSTEM

BACKGROUND OF THE INVENTION

1. Field of the Invention

The present invention relates to a substrate transfer apparatus of a substrate processing system, and more particularly, to a substrate transfer apparatus used in an inline film deposition system which deposits a film on a diskshaped substrate such as a magnetic disk or optical disk having a center hole. Further, this present invention relates to a technique for shortening a loading/unloading time to improve the throughput in film deposition etc. when loading or unloading a substrate by the transfer operation in the substrate transfer apparatus.

2. Description of the Related Art

A substrate transfer apparatus related to the present invention is disclosed in Japanese Unexamined Patent Publication (Kokai) No. 8-274142. This publication discloses an in-line film deposition system. This film deposition system includes a plurality of vacuum chambers functioning as film deposition chambers and other processing chambers. The plurality of vacuum chambers is connected continuously in series in a ring. Due to this, a polygonal ring-shaped transport path is formed. In this transport path, a substrate rotation vacuum chamber including a rotational mechanism is provided at each of corners. FIG. 1 of this publication shows a substrate loader for loading an unprocessed substrate from the outside to an in-line film deposition system and a substrate unloader for unloading a processed substrate from the inside of the film deposition system to the outside. The substrate loader mounts the substrate loaded into the film deposition system onto a carrier and moves it, for example, in the clockwise direction along the polygonal ring-shaped transport path to receive the necessary processing in the individual vacuum chambers. After the processing is completed, the substrate is unloaded to the outside by the substrate unloader.

The substrate loader and the substrate unloader are respectively provided with substrate transfer mechanisms and each of them functions as a substrate transfer apparatus.

The "substrate transfer apparatus" means an apparatus which takes out two substrates from substrate cassettes carrying a plurality of (25 etc.) substrates and mounts the two substrates to the substrate holders provided on the carrier moving inside the chambers of the in-line film deposition system, for example. In taking out and mounting the substrates according to the substrate transfer apparatus, for example, operations for picking up the substrates from the substrate cassettes, moving them, and mounting them onto holders are performed. The substrate transfer apparatus is provided with a robot having an arm for performing these operations. Further, in the above case, the substrate to be transferred is disk shaped and has a center hole. In transferring the substrate, the center hole is used as a hook portion when picking up the substrate.

Next, a more detailed explanation will be given about a conventional substrate transfer apparatus with reference to the figures. In this explanation, FIG. 6 to FIG. 9 will be referred.

FIG. 6 is a plane view of a substrate loader and a substrate unloader in the above in-line film deposition system. This figure schematically shows the internal structures of the substrate loader and part of the transport path. The substrate loader 101 and substrate unloader 102 are connected to a vacuum chamber 100 forming the part of the transport path. FIG. 6 shows only the internal structure of the substrate loader 101. The substrate loading operation in the substrate loader 101 and the substrate unloading operation in the substrate unloader 102 are opposite to each other. In the following paragraph, the transfer operation of a conventional typical substrate transfer apparatus will be explained by describing the substrate loading operation of the substrate loader 101.

The vacuum chamber 100 serving as part of the transport path is connected to vacuum chambers 103 provided at its both sides and is connected through these vacuum chambers 103 to vacuum chambers 104 forming the polygonal ring-shaped transport path. Valve gates 105 are provided between the vacuum chamber 100 and the vacuum chambers 103. Processing for film deposition is performed in the plurality of vacuum chambers 103 forming parts of the transport path. Reference numeral 106 indicates a carrier moving along the transport for carrying or transporting the substrates. The carrier 106 moves in the direction of the arrows 107. The vacuum chambers 103 are positioned at corners or bent portions of the polygonal transport path. Rotational mechanisms are built inside the vacuum chambers 103. Due to the rotational mechanisms, the direction of movement of the carrier 106 moving along the transport path is changed. Examples of the specific structures of the rotational mechanisms of the vacuum chambers 103 and polygonal transport path are disclosed in the above Japanese Unexamined Patent Publication (Kokai) No. 8-274142 for example. A detailed explanation will be omitted here.

The substrate loader 101 connected to the vacuum chamber 100 is comprised of one vacuum chamber 108 and two auxiliary vacuum chambers 109 and 110. The vacuum chamber 108 is connected to the above vacuum chamber 100 and includes a built-in robot 111 for the substrate loading operation. The auxiliary vacuum chambers 109 and 110 are connected to the vacuum chamber 108 through gate valves 112 and 113. In FIG. 6, the gate valve 112 is in the open state, while the gate valve 113 is in the closed state. The auxiliary vacuum chambers 109 and 110 are provided with loading doors, that is, gate valves 114 and 115, connected to the outside. The unprocessed substrates are introduced into the auxiliary vacuum chambers 109 and 110 through the gate valves 114 and 115. The auxiliary vacuum chambers 109 and 110 are provided with substrate cassettes 117 each carrying, for example, 25 substrates 116 arranged in a single row in a standing state in parallel with center axes aligned. The substrate cassettes 117 are affixed inside the auxiliary vacuum chambers 109 and 110. Only the substrates are introduced into the auxiliary vacuum chambers 109 and 110. At the auxiliary vacuum chambers 109 and 110, first, the inside and outside pressures are adjusted, and the gate valves 114 and 115 are operated to open the chambers to the atmosphere. Afterward, 25 unprocessed substrates are introduced, the gate valves 114 and 115 are closed and the chambers is evacuated, and the gate valves 112 and 113 are opened to transfer the substrates by the robot 111. These operations are repeated. The auxiliary vacuum chambers 109 and 110 are alternately used. The robot 111 moves as shown by the arrows 120 to pick up two substrates 116 from the substrate cassette 117 by the substrate pickup portion 119 formed at the front end of the front arm 18. Then it rotates as shown by the arrows 121 and moves the front arm 118 as shown by the arrows 122 to mount the two substrates 116 at predetermined locations of the holders of the carrier 106.

In the above, the auxiliary vacuum chambers 109 and 110, the vacuum chamber 100 forming the part of the transport path, and the vacuum chamber 108 provided with the robot 111 are evacuated up to a required vacuum level at desirable timings. The evacuation system is provided below the vacuum chamber. Here, the illustration and explanation of the evacuation system will be omitted since it is well known.

FIG. 7 shows an example of the substrate cassette 117. The substrate cassette 117 is comprised of four rods 130 arranged substantially in parallel. The four rods 130 are connected by end frames so that both ends thereof satisfies the positional relationship shown in FIG. 7. In FIG. 7, for convenience of the explanation, the illustration of the end frames is omitted. The substrate cassette 117 configured by the four rods 130 is in a state that at least the front end thereof in FIG. 7 is opened. A total of 25 grooves (not shown) are formed at predetermined equal intervals (for example, d) in the axial direction at least at locations inside the circumferential surfaces of the four rods 130. These grooves support the substrates 116. Due to this, the 25 substrates 116 are supported by the four rods 130, that is, the substrate cassette 117. The four rods 130 are placed in a positional relationship with the substrates 116 so as to support the substrates at the bottom halves. Therefore, in the substrate cassette 117, 25 substrates 116 are arranged at equal intervals of d in parallel and in a single row. Note that the substrates 116 are disk-shaped substrates such as magnetic disks or optical disks having center holes 116a. In present invention, the center holes 116a are used as hook parts, so each of the substrates 116 is required to have the center hole 116a. The substrates 116 carried in a substrate cassette 117 in this way are picked up by the robot 111 two at a time. The front end of the front arm 118 of the robot 111 is formed with two grooves 131 at an interval d. The substrates 116 are picked up by these grooves 131. The grooves 131 form the above pickup portion 119.

The appearance of the robot 111 is shown in FIG. 8. The robot 111 is provided with a rotating shaft 142 on a base 141. A base arm 143 is affixed on the top end of the rotating shaft 142. The base arm 143 is structured to rotate freely around the rotating shaft 142. The outside end of the base arm 143 has an intermediate arm 144 attached to it in a freely rotating manner. Further, the front arm 118 is provided to freely rotate at the outside end of the intermediate arm 144. The front arm 118, strictly speaking, is formed with a large base portion (118a) having a high strength. The front portion is formed as a thin or narrow portion (118b) able to be inserted into the center hole 116a of the substrate 116. At the top surface of the front end of the front arm 118 is formed the above pickup portion 119 (two grooves 131). The pickup portion 119 of the front arm 118 is made to move freely as shown by the arrows 120 and 121 based on the operation of the robot 111.

The carrier 106 is shown in FIG. 9. The carrier 106 is comprised of two holders 151 for carrying substrates 116 and a slider 152 provided with these holders. The carrier 106 has a plate-like shape overall and is used in a longitudinally standing state. The two holders 151 are each formed with circular holes 151a. The substrates 116 are attached to the holes 151a in the standing state. The holes 151a are provided with finger-like spring members (not shown) for holding down the substrates, for example. Under the slider 152 are alternately arranged N-pole and S-pole magnets 153. As shown by the arrow 107 the slider 152 is moved by the rotation drive mechanism using magnetic coupling provided under the bottom plate of the vacuum chamber 100.

Next, an explanation about the operation for loading substrates by the conventional substrate loader 101 having the above configuration will be made by referring to FIG. 6 to FIG. 9.

FIG. 6 shows the state where the auxiliary vacuum chamber 109 is evacuated to a required vacuum pressure in the state that the 25 substrates 116 are set in the substrate cassette 117 of the auxiliary vacuum chamber 109, the gate valve 112 is opened, and two substrates 116 are picked up from the substrate cassette 117 in the auxiliary vacuum chamber 109 and successively mounted to the two holders 151 of carriers 106 moving in the vacuum chamber 100. The robot 111 simultaneously takes out two substrates 116 from the substrate cassette 117 by the pickup portion 119 formed at the front end of the front arm 118 utilizing the center holes 116a as the hook parts and mounts them one by one to the two holders 151 of the carrier 106. The pickup portion 119 of the robot 111 holds the two substrates 116 arranged in the front-back direction. In this way, the 25 substrates 116 in the substrate cassette 117 set in a auxiliary vacuum chamber 109 are mounted two by two in the holders of the carriers 106 successively moved to the vacuum chamber 100 by the robot 111 of the vacuum chamber 108. During this time, the other auxiliary vacuum chamber 110 is opened once to the atmosphere, and unprocessed substrates are introduced through the loading door, that is, the gate valve 115. After the transfer operation of the robot 111 with respect to the substrate cassette 117 of the auxiliary vacuum chamber 109 is completed, the gate valve 112 of the auxiliary vacuum chamber 109 is closed, the gate valve 113 of the auxiliary vacuum chamber 110 is opened, and the robot 111 continues transferring substrates in the same way as above for the 25 substrates 116 newly introduced in the substrate cassette 117.

The substrate unloader 102 is configured substantially the same except for performing an operation opposite to the substrate transfer operation at the substrate loader 101. Therefore, the same reference numerals are assigned to the vacuum chamber, two auxiliary vacuum chambers, gate valves, etc. in the substrate unloader 102.

In the transfer operation of substrates by the conventional substrate loader 101, two substrates 116 are placed one by one in the holders 151 of the carrier 106 by the robot 111, so the mounting operation has to be performed two times. If the robot 111 picking up the two substrates 116 from the substrate cassette 117 does not successively perform the operation for mounting a substrate on the carrier 106 two times, the operation for mounting substrates on the next carrier cannot be performed. Therefore, in an in-line film deposition system, the transport speed of the carriers carrying the processed objects, that is, the substrates, is restricted by the operating speed of the substrate transfer by the robot 111. As a result, there was the problem that the throughput of the film deposition system as a whole is reduced and the production capacity of the system as a whole is restricted. To solve this problem, in so far as the configuration for substrate transfer of the related art is utilized, it is necessary to further increase the operating speed of the robot 111. Further increasing the operating speed of the robot itself, however, is difficult as the limit has been reached at the present time.

SUMMARY OF THE INVENTION

An object of the present invention is to provide a substrate transfer apparatus of a substrate processing system designed to increase the amount of substrates transferred per unit time and to enhance the processing capacity of the substrate processing system by improving the method of mounting substrates in holders on carriers without changing the operating speed of the robot.

The substrate transfer apparatus of the substrate processing system according to the present invention is configured as follows to achieve the above object.

The substrate processing system is provided with a plurality of vacuum chambers, a transport system, a plurality of carriers. The plurality of vacuum chambers is arranged in a polygonal ring shape and connected in series, and in each of the vacuum chamber substrates are processed in vacuum environments. The transport system is provided so as to pass through the vacuum chambers and forms a transport path of the polygonal ring shape. Each of the carriers carries at least two substrates with the substrate processing surfaces facing the sides of the transport direction. In the substrate processing system, the plurality of carriers move along the transport path at predetermined intervals by said transport system. At the time of movement, for example, in the stopped state, at least two substrates on a carrier are processed in the plurality of vacuum chambers. As the substrate processing system, there is typically an in-line film deposition system. Note that the scope of application of the substrate transfer apparatus according to the present invention is not limited to this however.

The substrate transfer apparatus is characterized by provision of a first vacuum chamber (corresponding to auxiliary vacuum chamber 17) having the following structure and a second vacuum chamber (corresponding to vacuum chamber 16). The first vacuum chamber is arranged at the outside and is provided with a plurality of first substrate cassettes arranged in parallel. Each of the first substrate cassettes is able to carry a plurality of substrates (preferably 25 substrates). Further, the first substrate cassettes are preferably arranged in two parallel rows. The second vacuum chamber is communicated with a transport vacuum chamber (corresponding to vacuum chamber 10c) through which carriers move along a transport path. The second vacuum chamber is provided with a first robot for substrate transport arranged at the first vacuum chamber side, a second robot for substrate transport arranged at the transport vacuum chamber side, and a plurality of second substrate cassettes arranged between the first robot and the second robot. A plurality of substrates is placed on the second substrate cassettes. The plural second substrate cassettes are arranged in parallel. The parallel second substrate cassettes normally have substantially the same structure as the first substrate cassettes. The substrates are disk-shaped substrates having center holes. The center holes of the substrates are utilized as hook parts for the pickup operation.

In the above configuration, more practically, all of the substrates placed on a substrate cassette can be simultaneously transferred by the first robot, while the substrates can be simultaneously mounted to all of the substrate holders provided at the carriers by the second robot. Therefore, according to the above configuration, it is possible to increase the number of substrates able to be simultaneously transferred (mounted to the holders or dismounted from the holders) utilizing the second robot. Due to this, it becomes possible to increase the amount of transfer of substrates per unit time by the substrate transfer apparatus, upgrade the substrate transport capacity by the substrate transport system, and enhance the film deposition or other processing capability by the substrate processing system.

Further, in the above configuration, the substrate transfer apparatus may be configured as a substrate loader. In this substrate transfer apparatus, the first vacuum chamber is used as a chamber for loading unprocessed substrates from the outside, unprocessed substrates are placed on the parallel plurality of first substrate cassettes, the first robot is simultaneously operated to transfer all of the unprocessed substrates placed on the first substrate cassettes on the parallel plurality of second substrate cassettes, and the second robot simultaneously takes out the front substrates from the plurality of second substrate cassettes and simultaneously mounts them on the holders of the carriers present in the transport vacuum chamber.

In the above configuration of the substrate loader, preferably the first substrate cassettes and the second substrate cassettes are arranged in two parallel rows, the carriers have two holders, the first robot has two substrate support rods at a bifurcated front arm, and the second robot has two substrate support blocks at a bifurcated front arm.

In the above configuration, the substrate transfer apparatus may also be configured as a substrate unloader. In the substrate transfer apparatus, the first vacuum chamber is used as a chamber for unloading the processed substrates to the outside, the second robot simultaneously dismounts the processed substrates from the holders of the carriers present in the transport vacuum chamber, transfers them on the parallel plurality of second substrate cassettes, and repeats this operation to fill the second substrate cassettes, the first robot is simultaneously operated to transfer all of the processed substrates placed on the plurality of second substrate cassettes to the parallel plurality of first substrate cassettes, and the processed substrates carried in the plurality of first substrate cassettes are unloaded to the outside.

In the above configuration of the substrate unloader, preferably the first substrate cassettes and the second substrate cassettes are arranged in two parallel rows, the carriers have two holders, the first robot has two substrate support rods at a bifurcated front arm, and the second robot has two substrate support blocks at a bifurcated front arm.

BRIEF DESCRIPTION OF THE DRAWINGS

These and other objects and features of the present invention will become clearer from the following description of the preferred embodiments given with reference to the attached drawings, in which.

DESCRIPTION OF THE PREFERRED EMBODIMENTS

Next, preferred embodiments of the present invention will be explained with reference to the attached drawings.

Figure 1:
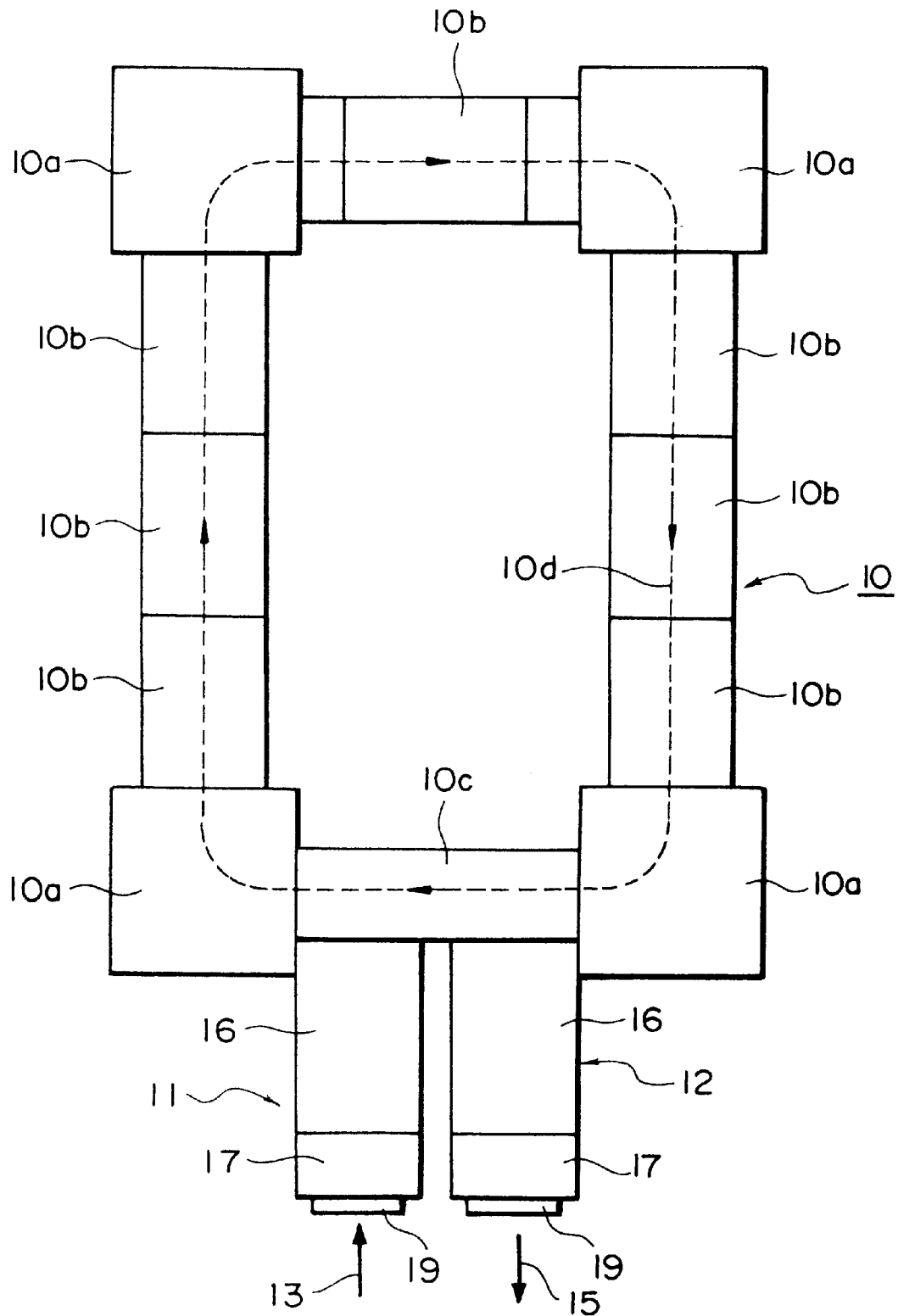
FIG. 1 is a plane view of an in-line type film deposition system to which the substrate transfer apparatus according to the present invention is applied.

FIG. 1 is a plane view of an example of a substrate processing system in which the substrate transfer apparatus according to the present invention is used. The substrate processing system 10 is, for example, an in-line film deposition system as explained in the related art (hereinafter referred to simply as the "film deposition system 10"). The film deposition system 10 is provided with a substrate loader 11 and substrate unloader 12 in the front in FIG. 1. The substrate loader 11 is an apparatus for loading the unprocessed substrates as shown by the arrow 13 into the film deposition system 10. The substrate unloader 12 is an apparatus for unloading the processed substrates as shown by the arrow 15 from the film deposition system 10. The substrate loader 11 and the substrate unloader 12 are arranged in parallel at close locations and both operate to transfer the substrates as explained later. The substrate transfer operations of the substrate loader 11 and the substrate unloader 12, however, are reverse. In the following explanation, the configuration and transfer operation of the substrate transfer apparatus according to the present invention will be explained focusing on the configuration and operation of the substrate loader 11.

Figure 9:
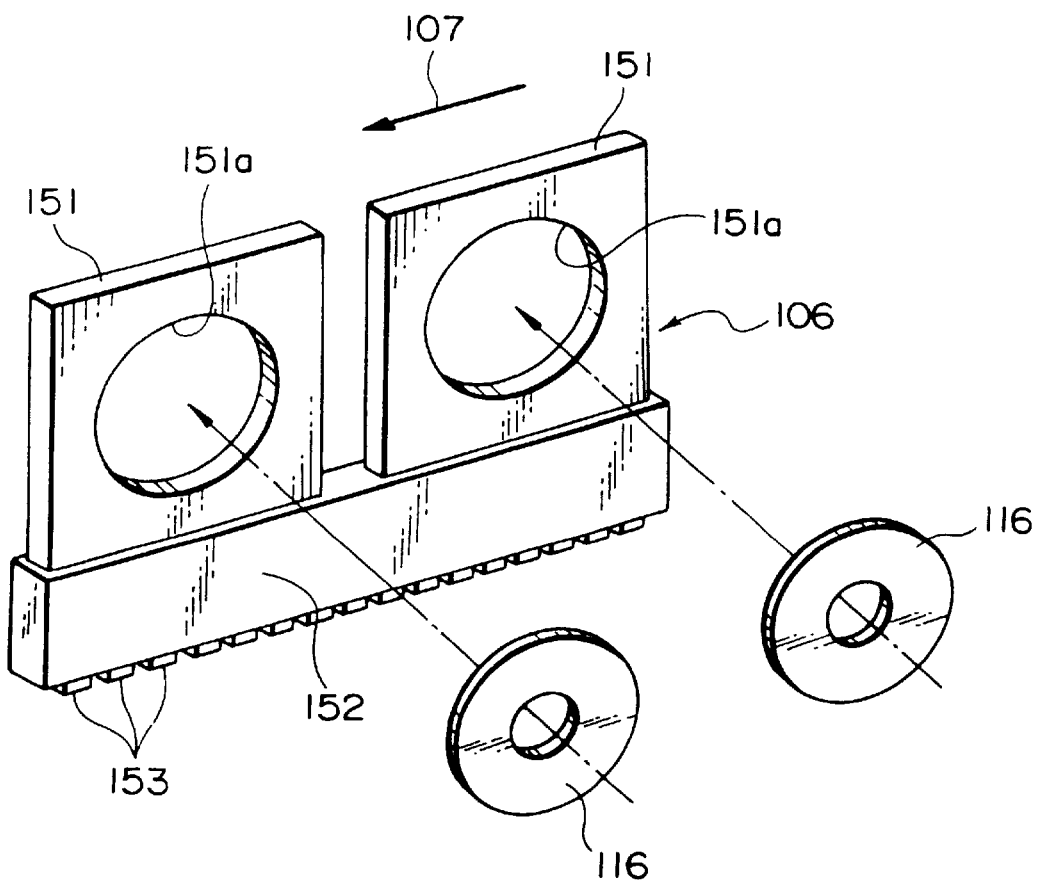
FIG. 9 is a perspective view of a carrier of the related art.

The film deposition system 10 is a film deposition system configured by a plurality of vacuum chambers 10a, 10b, and 10c. The vacuum chambers are arranged in series so as to form a polygonal ring shape overall. These vacuum chambers form a rectangular transport path 10d, for example. The transport path 10d drawn by the dotted line is a route over which the carriers move. The carriers move along the transport path 10d. In this embodiment, the carriers are substantially the same as the carrier shown in FIG. 9. Therefore, in the explanation of this embodiment as well, the explanation will be given using the same reference numerals. In such a carrier 106, substrates are mounted longitudinally horizontally in the substrate mounting holes 151a of the two holders 151. The substrates (the above-mentioned substrates 116) on which the films are formed or otherwise processed are transported along the transport path 10d in the state with the two surfaces facing the sides of the transport direction. The four vacuum chambers 10a are substrate rotation chambers positioned at the four corners in the film deposition system formed in a polygonal ring shape. Inside are provided rotational mechanisms for changing the direction of movement of the carriers by 90 degrees. Further, the plurality of vacuum chambers 10b positioned at the portions corresponding to the sides is processing vacuum chambers for film deposition etc. For example, they are provided with cathode mechanisms or targets or other sputtering systems. The vacuum chamber 10c forms part of the transport path. Here, two unprocessed substrates are mounted on the carriers 106 and two processed substrates are dismounted from the carriers 106.

Figure 2:
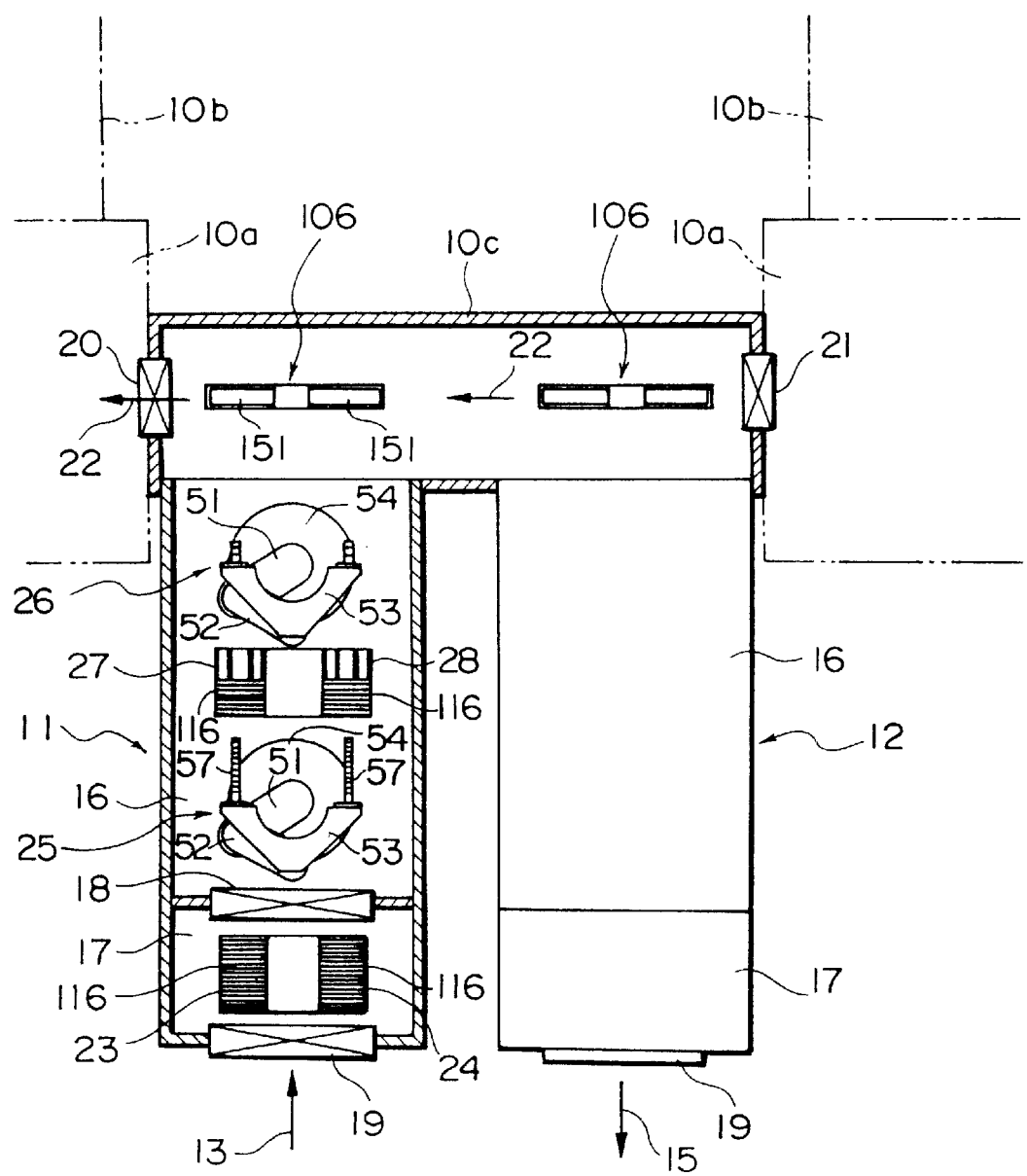
FIG. 2 is a plane view showing in detail a portion of the substrate loader and substrate unloader and related surrounding portions.

FIG. 2 is a plane view of the internal structure of the vacuum chamber 10c and the substrate loader 11. The inside of the substrate unloader 12 having substantially the same internal structure as the substrate loader 11 is not shown. The vacuum chambers 10a and 10b are drawn by imaginary lines. The substrate loader 11 is provided with one vacuum chamber 16 and auxiliary vacuum chamber 17. A gate valve 18 is provided at the interface of the vacuum chamber 16 and the auxiliary vacuum chamber 17. Normally, the gate valve 18 is closed and the vacuum chamber 16 and the auxiliary vacuum chamber 17 are isolated from each other. When loading and unloading the substrates, the gate valve 18 is opened. The vacuum chamber 16 and the auxiliary vacuum chamber 17 are each provided with evacuation systems under them. The vacuum chamber 16 is constantly communicated with the vacuum chamber 10c forming part of the transport path. In this embodiment, as one example, since the spaces of the vacuum chamber 16 and the vacuum chamber 10c are connected, they are evacuated by the same evacuation system. Note that the vacuum chamber 10c may also be divided into a portion corresponding to the substrate loader 11 and a portion corresponding to the substrate unloader 12 and be provided between them with a vacuum chamber of a cleaning system through a gate valve. In the cleaning system, the particles on the carriers or holders circulating through the film deposition system may be removed. The auxiliary vacuum chamber 17 is further provided with another gate valve 19. The gate valve 19 is used when introducing unprocessed substrates into the substrate loader 11 from the outside.

The vacuum chamber 10c forming part of the transport path is connected at its two sides, as explained above, to vacuum chambers 10a with built in rotational mechanisms through gate valves 20 and 21. Carriers 106 move into the vacuum chamber 10c by the opening of the gate valve 21. Carriers 106 are moved by on a drive mechanism using the magnetic coupling provided under the bottom plate of the vacuum chambers as explained above. In the transport path, a plurality of carriers 106 move in a row at predetermined intervals. In FIG. 2, two carriers 106 enter the vacuum chamber 10c. The arrow 22 shows the direction of movement of the carriers 106. The gate valve 20 opens when the carriers 106 emerge from the vacuum chamber 10c.

Figure 7:
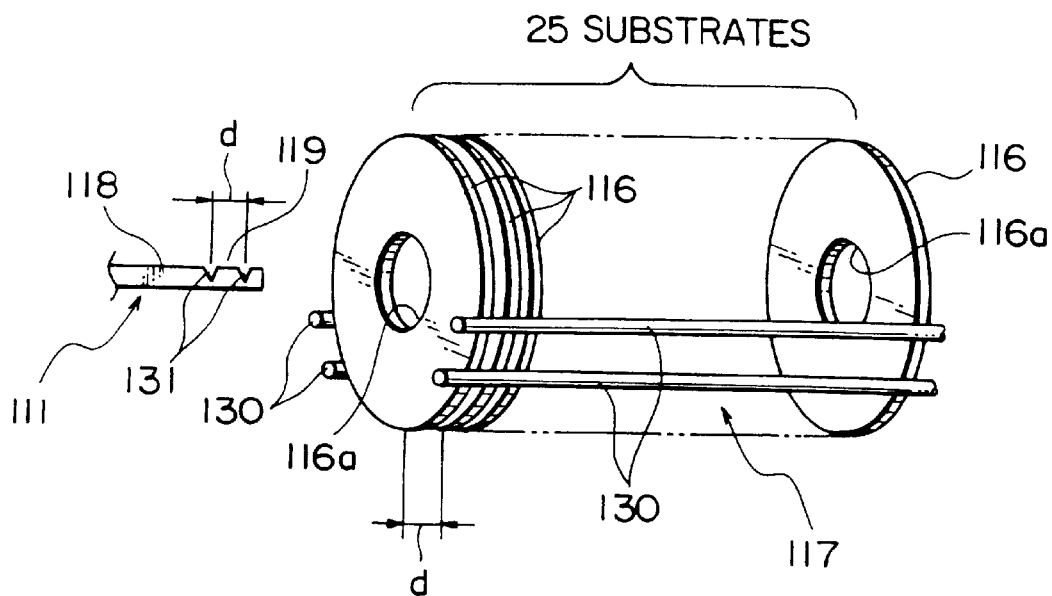
FIG. 7 is a perspective view of a conventional substrate cassette seen from the front and side.
Figure 8:
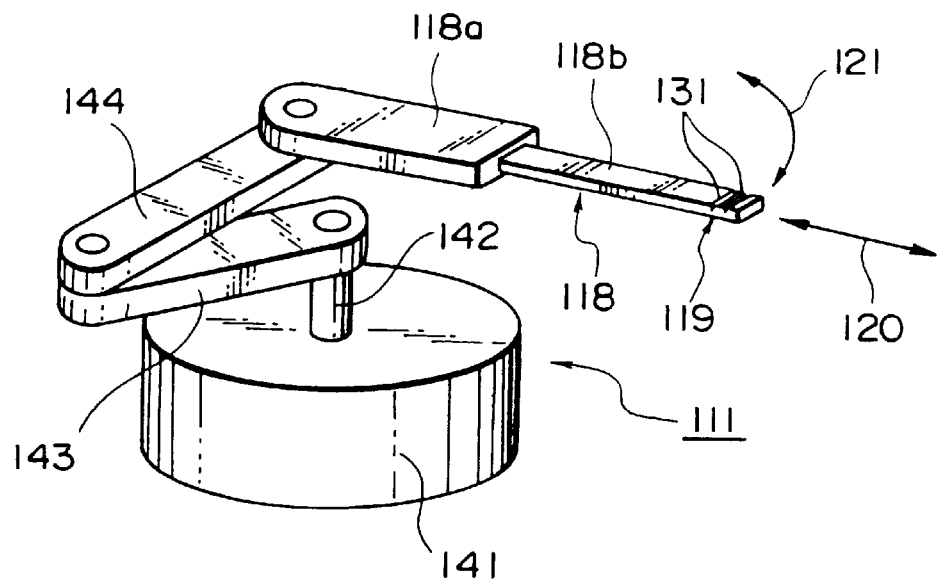
FIG. 8 is a perspective view of a robot provided at a substrate loader of the related art.

The auxiliary vacuum chamber 17 is provided with two substrate cassettes 23 and 24 in parallel. The substrate cassettes 23 and 24 are substantially the same as the above-mentioned substrate cassettes 117. The substrate cassettes 23 and 24 are affixed at their two ends to end frames etc. (not shown) so as to be held at predetermined intervals. Any end frames can be used. The substrate cassettes 23 and 24 and end frames constitute a cassette unit. The substrate cassettes 23 and 24 each contain for example 25 substrates. The substrates are the same as the substrates 116 explained in relation to the related art. In the explanation of the present embodiment, the explanation will be made using the same reference numerals. The arrangement of the substrates 116 in the two parallel substrate cassettes 23 and 24 is substantially the same as that shown in FIG. 7 etc. Further, the substrates 116 are disk-shaped substrates having center holes 116a in the same way as explained in relation to the related art. Two auxiliary vacuum chambers 17 were provided in the system of the related art, but only one is provided in the present embodiment. Instead, two substrate cassettes (23, 24) are provided in parallel inside a single auxiliary vacuum chamber.

Inside of the vacuum chamber 16 is provided two robots 25 and 26 used for substrate transfer (substrate transport) and a cassette unit comprised of two substrate cassettes 27 and 28. The cassette unit is the same as the above cassette unit (comprised of substrate cassettes 23 and 24) in structure and is provided at an intermediate position between the robots 25 and 26. The substrate cassettes 27 and 28 have the same structures as the substrate cassettes 23 and 24. The robot 25 is provided close to the auxiliary vacuum chamber 17. The robot 25 is a substrate transfer robot for simultaneously transferring the 25 substrates 116 arranged in each of the substrate cassettes 23 and 24 in the auxiliary vacuum chamber 17, 50 in total, to the substrate cassettes 27 and 28 in the vacuum chamber 16. The robot 26 is arranged close to the vacuum chamber 10c. The robot 26 is also a substrate transfer robot. It simultaneously takes out the front substrates among the substrates 116 placed in the substrate cassettes 27 and 28 provided inside the vacuum chamber 16, that is, two in total, and simultaneously mounts the two substrates 116 to the two holders 151 on a carrier 106. The robots 25 and 26 have basically the same configuration and are each comprised of three arms. The difference between the robots 25 and 26 lies in the configuration of the front arm and the number of substrates carried by the same and the method of carrying. The configurations of the robots 25 and 26 will be explained in detail later.

Figure 3A:
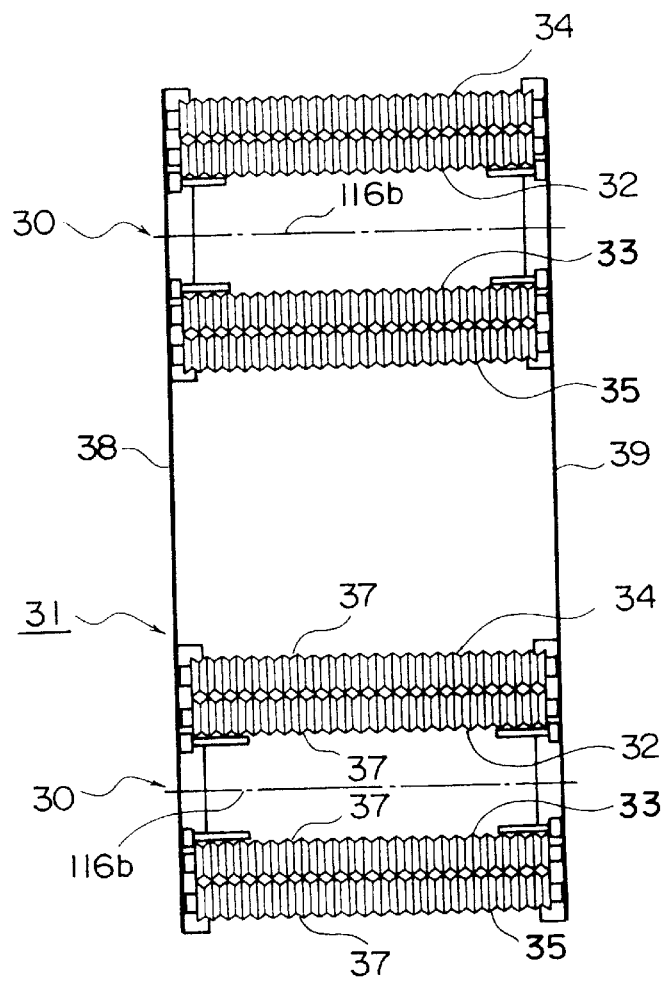
FIG. 3A is a plane view of a substrate cassette.
Figure 3B:
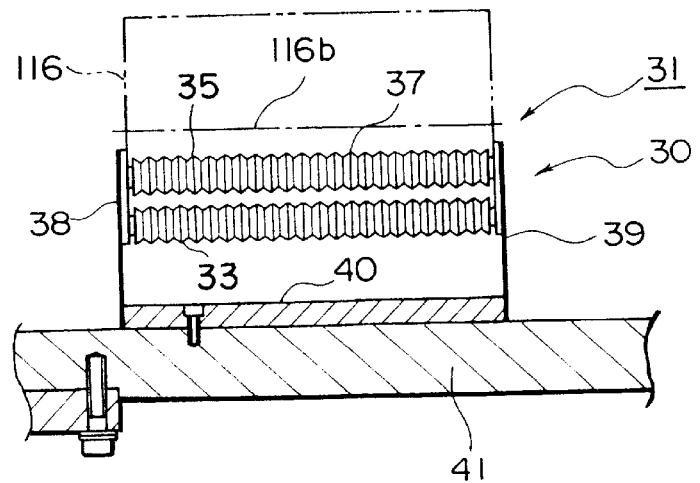
FIG. 3B is a side view of a substrate cassette.

FIG. 3A and FIG. 3B are a plane view and side view of the substrate cassettes 23, 24, 27, and 28. In FIGS. 3A and 3B, reference numeral 30 is assigned to a substrate cassette, while reference numeral 31 is assigned to a cassette unit produced by two substrate cassettes 30 arranged in parallel. A substrate cassette 30, as explained in the related art, is configured by four parallel rods 32, 33, 34, and 35. The rods 32 to 35 are arranged at positions below the line 116b formed by the center axes of the substrates 116. The rods 32 and 33 are positioned below while the rods 34 and 35 are positioned above. The rods 32 to 35 are each formed with for example 25 grooves 37 with for example V-shaped cross-sections in the circumferential direction of their surfaces. The substrates 116 are supported by the V-shaped grooves. Twenty-five substrates 116 are carried in each of the substrate cassettes 30. In FIGS. 3A and 3B, a state with 25 substrates 116 carried in the substrate cassette 30 is shown. The left and right ends of the four rods in FIGS. 3A and 3B are fixed to the end plates 38 and 39. In FIGS. 3A and 3B, reference numeral 40 is a base member for affixing the end plates 38 and 39. The base member is screwed etc. to the bottom plate 41 of the vacuum chamber. The end plates 38 and 39 are formed to leave the top portions of the substrates 116 from the portions around the center holes 116a of the substrates exposed. The substrate cassette 30 need only be one with for example 25 substrates 116 arranged in parallel in a row in the direction of their center axes. Its configuration is not limited to that illustrated. Any configuration may be employed. In this embodiment, the substrate cassette 30 is realized by arranging the four rods 32 to 35 in parallel. Further, a cassette unit 31 is realized by arranging the substrate cassettes 30 in parallel.

Figure 4A:
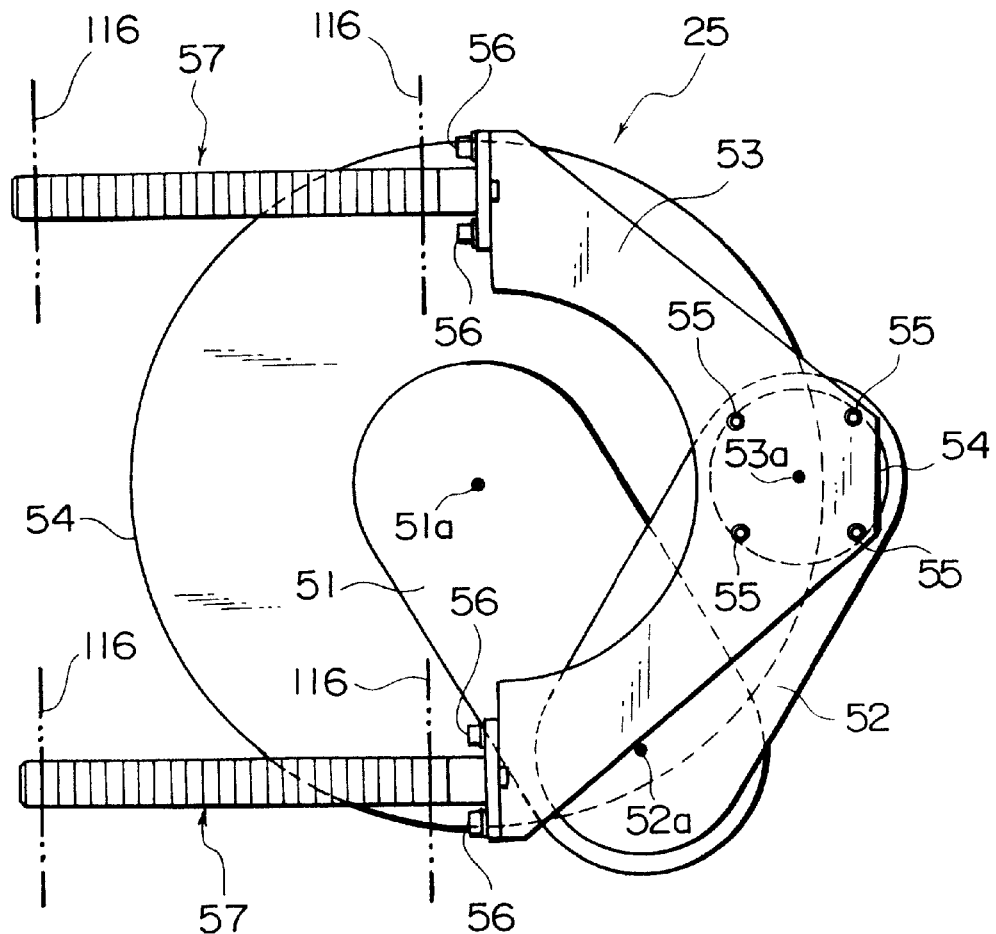
FIG. 4A is a plane view of a first substrate transfer robot.
Figure 4B:
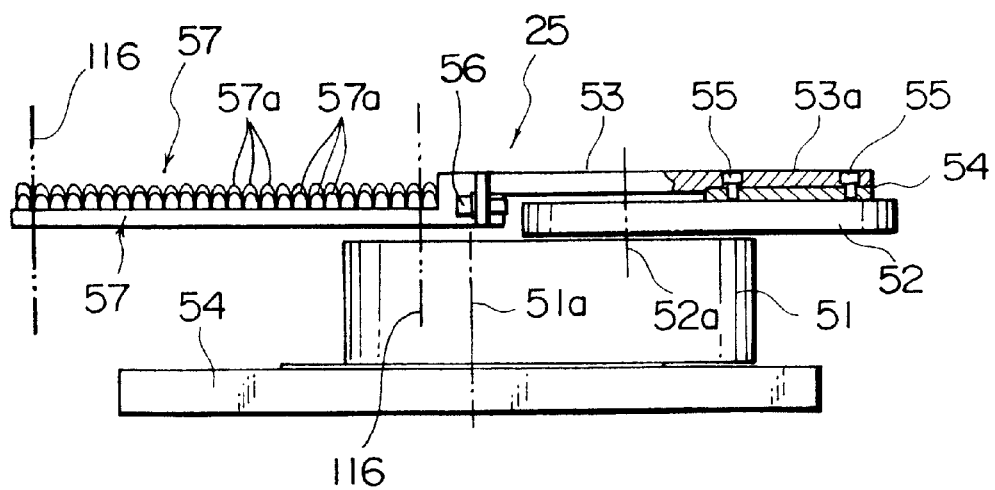
FIG. 4B is a side view of a first substrate transfer robot.

Next, an explanation will be made of the robot 25 referring to FIG. 4A and FIG. 4B. FIG. 4A is a plane view of the robot 25, while FIG. 4B is a side view of the same. The robot 25 has a multi-articulated arm and functions to move a predetermined number (in this example, a total of 50 at the left and right) substrates 116 by its front end. The structural part of the multi-articulated arm is configured by a base arm 51, intermediate arm 52, and front arm 53. In the robot 25, the base arm 51 is provided on a base 54 affixed to the bottom plate of the vacuum chamber 16 so as to be able to freely rotate around its axis 51a. The intermediate arm 52 is provided at the base arm 51 so as to be able to freely rotate around its axis 52a. The front arm 53 is provided at the intermediate arm 52 so as to be able to freely rotate around its axis 53a. An intermediate member 54 is provided between the intermediate arm 52 and the front arm 53. The front arm 53 is affixed to the intermediate member 54 by screws 55. Further, the multi-articulated is configured to be able to be changed in height as well. The base arm 51 and the intermediate arm 52 are formed as arm members having the required lengths. The front arm 53 is formed bifurcated similar to a V-shape in planar shape. Substrate support rods 57 are affixed by bolts 56 to the fronts of the bifurcated portions of the front arm 53. In the bifurcated front arm 53, two substrate support rods 57 are provided in parallel at left and right positions. Further, the interval between center lines of the two substrate support rods 57 is substantially equal to the interval between center lines of the parallel arranged substrates in the two substrate cassettes in the cassette unit 31. At the top surface of each of the substrate support rods 57 are formed a plurality of ridges 57a so as to form 25 grooves. The ridges 57a are preferably formed with rounded peaks. One substrate support rod 57 simultaneously supports 25 substrates 116 by the 25 grooves formed by the 26 ridges 57a. For convenience in explanation, in FIGS. 4A and 4B, only the two substrates 116 positioned at the front end and the rear end are shown. According to the front arm 53 provided with the two substrate support rods 57, it is possible to simultaneously move 50 substrates.

Figure 5A:
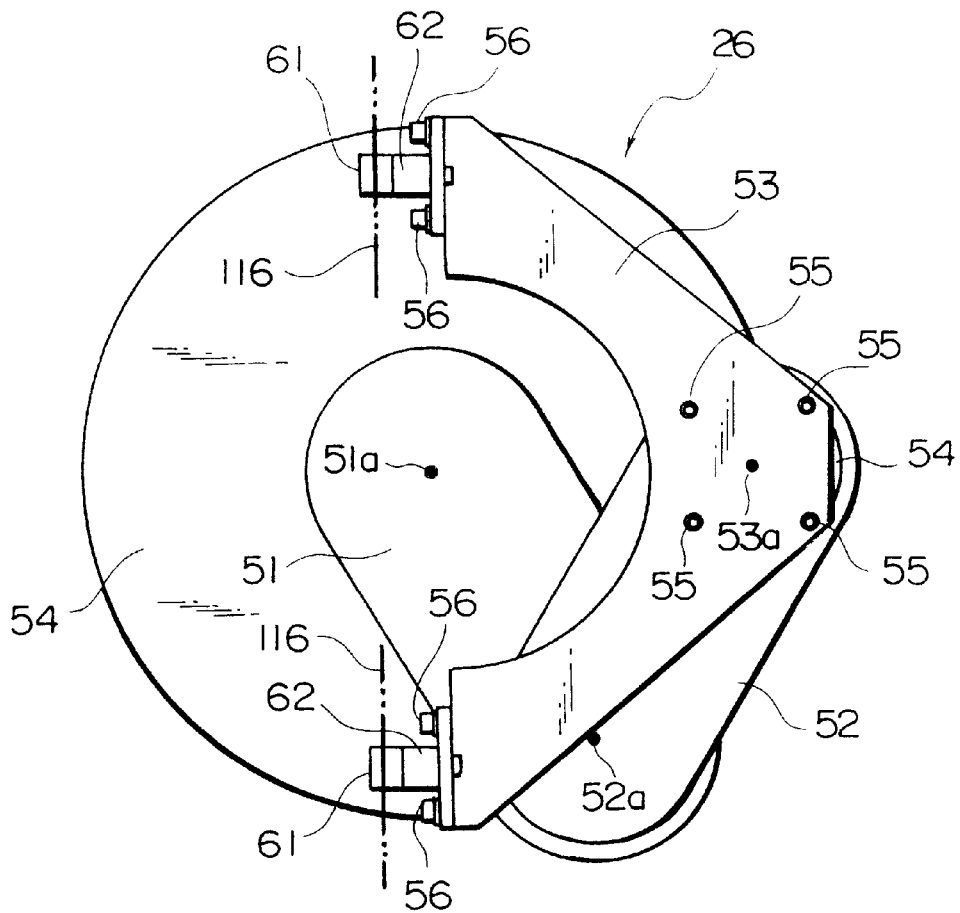
FIG. 5A is a plane view of a second substrate transfer robot.
Figure 5B:
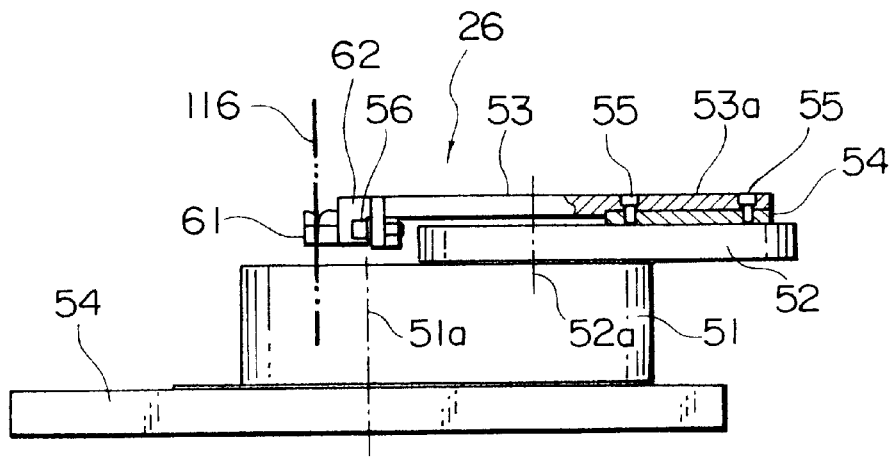
FIG. 5B is a side view of a second substrate transfer robot.
Figure 6:
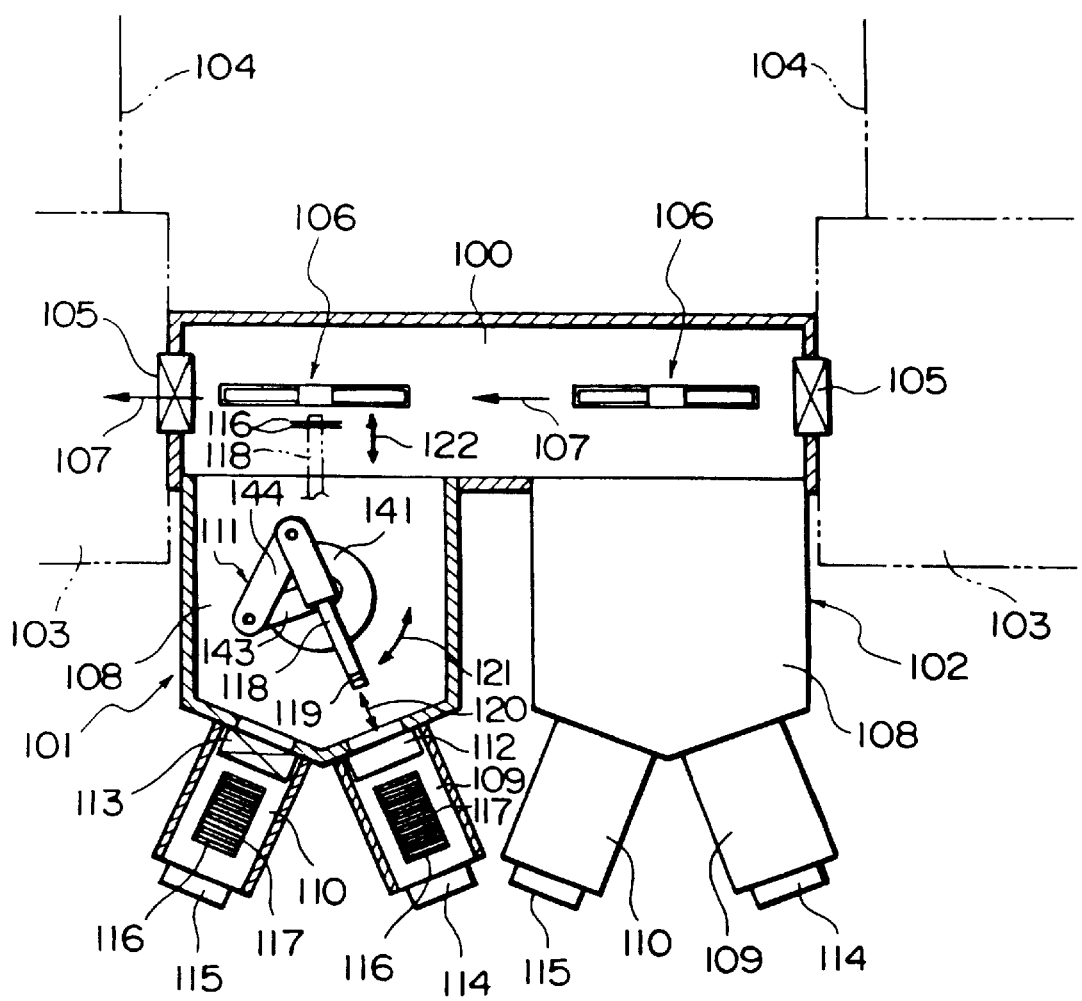
FIG. 6 is a plane view of a portion of a typical substrate loader and substrate unloader of the related art and related surrounding portions.

Next, an explanation will be made of a robot 26 with reference to FIG. 5A and FIG. 5B. FIG. 5A is a plane view of the robot 26, while FIG. 5B is a side view of the same. The robot 26, like the robot 25, has a multi-articulated arm and functions to move a predetermined number (in this example, two at the right and left) of substrates 116 by its front end. In the robot 26 shown in FIGS. 5A and 5B, the same reference numerals are assigned to the substantially same elements as explained with reference to the robot 25 and explanations are omitted. The characteristic features will be mainly explained. The robot 26 also has a multi-articulated art comprised of a base arm 51, intermediate arm 52, and front arm 53. Substrate support blocks 61 are bolted to the fronts of the bifurcated parts of the front arm. The substrate support blocks 61 provided with single V-grooves in their top surfaces. A single substrate 116 is held by a V-groove. Therefore, two substrates can be simultaneously supported and moved at the left and right portions of the front arm 53. The interval between center lines of the two substrate support blocks 61 is substantially equal to the interval between center lines of the parallel arranged substrates in the two substrate cassettes 30. The two substrate support blocks 61 of the front arm 53 function as pickup portions when taking out two substrates 116 from the substrate cassettes 27 and 28. As explained above, according to the front arm 53 provided with the two substrate support blocks 61, it is possible to simultaneously move two substrates. Further, a buffer member 62 utilizing for example a coil spring etc. is provided at each substrate support block 61. The buffer member 62 is a means for preventing damage to the substrates 116 etc. when mounting two substrates 116 to the holes 151a of the two holders 151 of a carrier 106. Note that the buffer member 62 is not essential and may be omitted.

An explanation will be made next of an operation for loading substrates (operation for transferring substrates from substrate cassettes to holders of carriers) by the substrate loader 11 having the above configuration. The operations of the substrate loader 11 are comprised of an operation for opening and closing the gate valve, an operation for evacuating the vacuum chambers, and operations for loading substrates from the outside and moving the substrates by the robots 25 and 26. These operations are performed under certain synchronous relationships under the control of the controller performing sequence control. In the following explanation, the relationship with the controller will not be explained, as it is well known. The content of the series of operations will be explained.

In the substrate loader 11, first, for example nitrogen ($N_2$) gas is introduced from a vent valve (not shown) provided at the auxiliary vacuum chamber 17 to equalize the pressure with the atmosphere, then the gate valve 19 is opened to open the auxiliary vacuum chamber 17 to the atmosphere. In this state, 50 unprocessed substrates 116 are introduced from the outside and inserted into the substrate cassettes 23 permanently set at the auxiliary vacuum chamber 17. Twenty-five substrates 116 are inserted into each of the substrate cassettes 23 and 24. Next, the gate valve 19 is closed and the auxiliary vacuum chamber 17 is evacuated to attain the required pressure.

Next, the gate valve 18 at the interface is opened. When the gate valve 18 is opened, the robot 25 operates to bring the front arm 53 in front of the substrates 116 in the substrate cassettes 23 and 24. The two substrate support rods 57 affixed to the bifurcated front arm 53 are positioned at the center holes 116a of the substrates carried in the substrate cassettes 23 and 24, then the substrate support rods 57 are inserted into the center holes 116a of the two sets of 25 substrates of the corresponding substrate cassettes by moving the front arm 53 toward the substrate side. The substrate support rods 57 are stopped when the 25 V-grooves formed in each of them align with the 25 substrates 116. Next, the robot 25 operates so that the substrate support rods 57 move upward to lift the 25 left and right substrates 116, that is, the total 50 substrates 116 in all, from the substrate cassettes 23 and 24, then the robot rotates in a state not contacting the surrounding members to carry the 50 substrates 116 to the substrate cassettes 27 and 28 positioned at the intermediate location and positions and inserts them into the substrate cassettes 27 and 28. The robot 25 then returns to the original standby position and is held in a standby state.

Next, receiving a signal indicating that the robot 25 has completed its predetermined operation, the robot 26 starts the operation for substrate transfer. The robot 26 operates so that the substrate support blocks 61 provided at the front ends of the bifurcated parts of the front arm 53 face the center holes 116a of the substrate. The substrate support blocks 61 are inserted into the center holes 116a of the substrates 116 positioned in the front among the substrate cassettes 27 and 28, hook the substrates 116 by their V-grooves, and simultaneously take out the front substrates (two substrates in all) of the substrate cassettes 27 and 28. Next, the robot 26 rotates by the arm mechanism as a whole so that the front arm 53 turns for example 180 degrees so as to face a carrier 106. That is, it operates so that the two substrate support blocks 61 of the bifurcated front ends of the front arm face the holes 151a of the two holders 151 of the carrier 106. In the state with the center holes 151a of the two holders 151 and the two substrates 116 positioned with each other, the robot 26 makes the front arm 53 move forward and mounts the two substrates 116 to the holes 151a of the two holders 151. Next, the robot 26 operates in reverse and similarly takes out two substrates from the two groups of the remaining 24 substrates 116 of the substrate cassettes 27 and 28. During this time, the carrier 106 carrying the two substrates passes through the open gate valve 20 and moves in the direction shown by the arrow 22. Next, a next carrier 106 provided with empty holders arrives at a predetermined location of the vacuum chamber 10c. The robot 26 mounts the next two picked up substrates 116 on this next carrier by a similar operation as above. The robot 26 repeats the above operation for the substrates carried in the substrate cassettes 27 and 28 and mounts two substrates each on the holders of the successively moving carriers 106.

While the robot 26 is operating to move the substrates as explained above, the vent valve of the auxiliary vacuum chamber 17 is opened and nitrogen gas is introduced as explained above, then the gate valve 19 is opened to open the chamber to the atmosphere, 50 unprocessed substrates are introduced and inserted into the permanently set substrate cassettes, then the chamber is again evacuated. At the stage when the preparations at the auxiliary vacuum chamber 1 side are completed, the gate valve 18 is opened and the robot 25 is able to move the 50 unprocessed substrates carried in the substrate cassettes 23 and 24 to the substrate cassettes 27 and 28. At the stage when the robot 26 takes out the final two substrates 116 from the substrate cassettes 27 and 28, the robot 25 receiving the signal of that state confirms the empty state of the substrate cassettes 27 and 28 and, as explained above, simultaneously moves 50 substrates from the substrate cassettes 23 and 24 to the substrate cassettes 27 and 28 and then is held in the standby state. Explaining this in further detail, the robot 25 picks up 50 substrates from the substrate cassettes 23 and 24 and turns, the gate valve 18 closes, then the auxiliary vacuum chamber 17 is opened to the atmosphere as explained above and preparations are made for introducing the next 50 unprocessed substrates. Note that a robot mechanism for loading 50 unprocessed substrates is provided at the outside of the auxiliary vacuum chamber 17. Further, the robot 25 stands by while holding the 50 substrates until the timing for inserting the substrates in the substrate cassettes 27 and 28. After receiving the final takeout signal, it inserts 50 substrates in the substrate cassettes 27 and 28.

Due to the above, the auxiliary vacuum chamber 17 can perform the work of evacuation, venting, etc. without regard as to the timing of handling of the substrates 116.

As explained above, the operation for loading substrates to the carriers 106 of the film deposition system 10 (transfer operation) is continued by the loading of unprocessed substrates 116 from the outside and the movement of the substrates by the robots 25 and 26. According to the present embodiment, even if there is a single auxiliary vacuum chamber, the operation is not regulated in speed and it is possible to enhance the capability of the loading operation two-fold. That is, the embodiment is configured so that two substrates are simultaneously mounted in two holders 151 of a carrier 106 by the robot 126. Since the speed is regulated by the operating capacity of the robot 26, it is possible to enhance the capacity of the loading operation two-fold and possible to enhance the transport capacity of the substrates two-fold and enhance the processing capacity of the film deposition system 10 two-fold.

Note that, naturally, regarding the process of the film deposition at the vacuum chambers 10b of the film deposition system 10, the efficiency of the film deposition is improved so there are no limits on the improvement of the processing capability.

On the other hand, the substrate unloader 12 is also provided with the vacuum chamber 16 and the single auxiliary vacuum chamber 17 and is configured the same as the substrate loader 11. In the unloading operation of the substrates 116 at the substrate unloader 12, however, the substrates 116 on which the film has been finished being formed at the film deposition system 10 are transported by the carriers 106 to the vacuum chamber 10c, then the robot 26 moves two substrates from the holders of the carrier to the substrate cassettes 27 and 28 positioned in the middle. The robot 26 repeats these actions. At the point of time when 50 substrates are carried in the substrate cassettes 27 and 28, the robot 25 transfers the 50 substrates of the substrate cassettes 27 and 28 simultaneously to the substrate cassettes 23 and 24 of the auxiliary vacuum chamber 17. During this time, the robot 26 repeatedly moves substrates from the carriers 106 to the substrate cassettes 27 and 28. The substrates formed with the film moved to the substrate cassettes of the auxiliary vacuum chamber 17 are unloaded from the unloading door, that is, the gate valve 19, to the outside after the auxiliary vacuum chamber 17 is opened to the atmosphere as explained above. Next, the auxiliary vacuum chamber 17 is closed and evacuated to a predetermined level. In this way, the substrate unloading operation by the substrate unloader 12 is similarly not regulated by the auxiliary vacuum chamber, and the production capacity of the film deposition system 10 is improved.

In the above embodiment, the substrate transfer operation by the robot 26 simultaneously transferred two substrates, but the invention is not limited to this. For example, it is also possible to give the front arm three or four front ends etc. to simultaneously take out and mount three or four substrates. According to that configuration, it would be possible to further improve the transport efficiency and production efficiency.

While the invention has been described by reference to specific embodiments chosen for purposes of illustration, it should be apparent that numerous modifications could be made thereto by those skilled in the art without departing from the basic concept and scope of the invention.

What is claimed is:

1. A substrate transfer apparatus of a substrate processing system, said substrate processing system comprised of:
    a plurality of vacuum chambers connected in series to form a polygonal ring shape, in each of which substrates are processed in vacuum environments,
    a transport system provided in said vacuum chambers to form a transport path of the polygonal ring shape, and
    a plurality of carriers transported along said transport path at predetermined intervals by said transport system, each of which holds at least two of the substrates,
    said substrate transfer apparatus further comprising;
        a first vacuum chamber arranged at an outside of the substrate processing system and provided with a plurality of first substrate cassettes arranged in parallel, on each of which a plurality of substrates is-placed,
        a second vacuum chamber communicating with a transport vacuum chamber through which said carriers move along said transport path, and provided with a first robot for substrate transfer arranged at a side of said first vacuum chamber, a second robot for substrate transfer arranged at a side of said transport vacuum chamber, and a plurality of second substrate cassettes arranged in parallel between said first robot and said second robot, on each of which a plurality of substrates is placed.

2. A substrate transfer apparatus of a substrate processing system as set forth in claim 1,
    wherein said first vacuum chamber is used for loading unprocessed substrates from the outside, said unprocessed substrates are placed on said parallel first substrate cassettes, said first robot is operated to transfer all of the unprocessed substrates placed on said first substrate cassettes simultaneously to said second substrate cassettes, and said second robot simultaneously takes out front substrates from each of said plurality of second substrate cassettes and simultaneously mounts them in holders of said carriers in the transport vacuum chamber.

3. A substrate transfer apparatus of a substrate processing system as set forth in claim 2,
    wherein said first substrate cassettes and said second substrate cassettes are both arranged in two parallel rows, each of said carriers has two holders, said first robot has a bifurcated front arm with two substrate support rods, and said second robot has a bifurcated front arm with two substrate support blocks.

4. A substrate transfer apparatus of a substrate processing system as set forth in claim 1,
    wherein said first vacuum chamber is used for unloading processed substrates to the outside, said second robot simultaneously dismounts the processed substrates from holders of said carriers coming into said transport vacuum chamber, places them on said parallel second substrate cassettes, and repeats the operations to fill said second substrate cassettes, said first robot is operated to simultaneously transfer all of the processed substrates placed on said second substrate cassettes to said first substrate cassettes, and the processed substrates placed on said first substrate cassettes are unloaded to the outside.

5. A substrate transfer apparatus of a substrate processing system as set forth in claim 4,
    wherein said first substrate cassettes and said second substrate cassettes are both arranged in two parallel rows, each of said carriers has two holders, said first robot has a bifurcated front arm with two substrate support rods, and said second robot has a bifurcated front arm with two substrate support blocks.

* * * * *